(12) United States Patent
Hong et al.

(10) Patent No.: US 9,399,813 B2
(45) Date of Patent: Jul. 26, 2016

(54) TIAGN COATING LAYER, TIAGN COATING METHOD AND TIAGN COATING APPARATUS

(71) Applicant: Hyundai Motor Company, Seoul (KR)

(72) Inventors: Woong Pyo Hong, Gyeonggi-do (KR); In Woong Lyo, Gyeonggi-do (KR); Hyuk Kang, Gyeonggi-do (KR); Kwang Hoon Choi, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 425 days.

(21) Appl. No.: 13/830,250

(22) Filed: Mar. 14, 2013

(65) Prior Publication Data

US 2014/0170051 A1 Jun. 19, 2014

(30) Foreign Application Priority Data

Dec. 14, 2012 (KR) .................. 10-2012-0146054

(51) Int. Cl.
*C01B 21/00* (2006.01)
*C23C 14/06* (2006.01)
*C01B 21/076* (2006.01)
*C01B 21/06* (2006.01)
*H01J 37/32* (2006.01)

(52) U.S. Cl.
CPC .......... *C23C 14/0641* (2013.01); *C01B 21/0602* (2013.01); *C01B 21/0761* (2013.01); *H01J 37/32082* (2013.01)

(58) Field of Classification Search
None
See application file for complete search history.

(56) References Cited

U.S. PATENT DOCUMENTS 6,261,694 B1   7/2001   Iacovangelo
2013/0202811 A1*  8/2013   Choi et al. .................... 427/534

FOREIGN PATENT DOCUMENTS

| KR | 10-2003-0057499 A | 7/2003 |
| KR | 10-2005-0042549 A | 5/2005 |
| KR | 10-2011-0016347 | 2/2011 |
| KR | 10-2011-0016347 A | 2/2011 |

OTHER PUBLICATIONS

Whitehead et al, "Surface topography and physicochemistry of silver containi9ng titanium nitride nanocomposite coatings", J. Vac. Sci. Tech. B 28(1), Jan./Feb. 2010, 738-743. (no month).*

Ma, Xinxin et al., "Preparation of Ti/N and Ag/TiNx multilayers by plasma based ion implantation with multi-targets unbalanced magnetron sputtering", Materials Letters, 44(2000) pp. 170-174.

Myung, H.S. et al., "A study on the synthesis and formation behavior of nanostructured TiN films by copper doping", Surface and Coatings Technology, vol. 177-178, (Jan. 30, 2004) pp. 404-408.

* cited by examiner

*Primary Examiner* — Wayne Langel
(74) *Attorney, Agent, or Firm* — Mintz Levin Cohn Ferris Glovsky and Popeo, P.C.; Peter F. Corless

(57) ABSTRACT

Disclosed is a TiAgN coating layer, formed by subjecting a substrate having a surface roughness of about 0.05~0.1 μm to plasma coating by periodically turning on/off an Ag source while a Ti source is continuously turned on in a nitrogen gas atmosphere, a TiAgN coating method, and a TiAgN coating apparatus.

4 Claims, 7 Drawing Sheets

TIAGN COATING LAYER, TIAGN COATING METHOD AND TIAGN COATING APPARATUS

CROSS-REFERENCE TO RELATED PATENT APPLICATION

This application claims the benefit of Korean Patent Application No. 10-2012-0146054, filed on Dec. 14, 2012 in the Korean Intellectual Property Office, the disclosure of which is incorporated herein in its entirety by reference.

BACKGROUND OF THE INVENTION

1. Field of the Invention

The present invention relates to a TiAgN coating layer, a TiAgN coating method, and a TiAgN coating apparatus, particularly wherein a TiAgN coating monolayer is provided in the form of a nano complex having a grain size of about 50~100 nm. More particularly, the present invention provides a TiAgN coating layer, method, and apparatus wherein the coating layer is provided via control of the rotation speed of a jig in a chamber and adjustment of the roughness of a substrate before coating, thereby providing a coating layer that exhibits both low friction characteristics and heat resistance, and thereby increasing mass productivity.

2. Description of the Related Art

A TiAgN coating, which has overcome poor heat resistance of DLC, is currently available as a coating for engine driving parts. This coating has low friction characteristics and high heat resistance. However, as the amount of Ag increases in the coating to provide the low friction characteristics, hardness may be decreased. As a result, the coating is provided with undesirably poor durability.

Although this problem may be solved by manufacturing a TiAgN/TiN multilayer coating, upon formation of the multilayer coating, TiN (heat resistance)/Ag (low friction) layers may become discontinuous in the TiAgN coating monolayer. As a result it becomes, impossible to provide both the necessary low friction characteristics and heat resistance. Also, there are difficulties in achieving mass production due to the use of hybrid PVD (physical vapor deposition) to form the multilayers.

Korean Unexamined Patent Application Publication No. 10-2011-0016347 (KR10-2011-0016347 A), entitled "Method of forming electronic material film, and method and apparatus for manufacturing electronic device using the same," discloses that "The present invention is directed to a method of forming a thin film for use in electronic and electrical devices using sputtering. This film may protect a substrate or a lower layer or structure formed on the substrate from damage due to plasma and may have good electrical/material properties. The target material may include conductive, semiconductive, resistive materials, etc., or examples thereof may include TCO (Transparent Conductive Oxide) such as ITO (Indium Tin Oxide). A deposition process includes forming a unit electronic material film or a unit electrode layer via sputtering and surface-treating the unit electronic material film or the electrode layer using neutral particle beams obtained from non-reactive elements."

Nevertheless, there are no known techniques for manufacturing the TiAgN/TiN multilayer coating nor techniques for exhibiting not only heat resistance but also low friction characteristics.

The foregoing is intended merely to aid in the understanding of the background of the present invention, and is not intended to mean that the present invention falls within the purview of the related art that is already known to those skilled in the art.

CITATION LIST

Patent Literature (Patent Document 1) KR10-2011-0016347 A

SUMMARY OF THE INVENTION

Accordingly, the present invention provides a TiAgN coating layer, a TiAgN coating method, and a TiAgN coating apparatus that provide a TiAgN coating layer that exhibits both low friction characteristics and heat resistance. More particularly, according to the present invention, a TiAgN coating monolayer is provided in the form of a nano complex having a grain size of about 50~100 nm via control of the rotation speed of a jig in a chamber and adjustment of the roughness of a substrate before a coating process. Such a method beneficially allows for an increase in mass productivity.

According to one aspect, the present invention provides a TiAgN coating method using a plasma coating process, including processing the surface of a substrate to form a surface roughness of about 0.05~0.1 μm; and introducing a nitrogen gas into a chamber in which the substrate is provided, turning on a Ti source, and periodically turning on/off an Ag source, thus forming a TiAgN coating layer. As a result the coating layer contains both TiAgN portions and TiN portions. These portions can be provided as one or more alternating layers which may be discontinuous (i.e., one or more layers of TiAgN and/or TiN may be a partial layer that covers only one or more portions of a surface such as shown in the discontinuous layers in FIG. 3).

According to various embodiments, the forming of the TiAgN coating layer includes disposing the Ti source and the Ag source to face each other while the substrate is positioned therebetween.

According to various embodiments, the forming the TiAgN coating layer includes rotating a jig which holds the substrate.

According to various embodiments, the forming the TiAgN coating layer includes rotating a jig which holds the substrate, particularly rotating at about 20~50 rpm.

According to various embodiments, the forming the TiAgN coating layer includes periodically turning on/off the Ag source particularly at an interval of about 30~240 sec (i.e. wherein the interval is the time between switching between on and off or between off and on).

According to another aspect, the present invention provides a TiAgN coating layer, formed by subjecting a substrate having a surface roughness of about 0.05~0.1 μm to plasma coating by periodically turning on/off an Ag source under a condition of a Ti source being continuously turned on in a nitrogen gas atmosphere. As a result, the coating can be in the form of one or more portions or layers of TiAgN and TiN sequentially formed by the turning on/off of the Ag source.

According to further aspects, the present invention provides a TiAgN coating apparatus using a plasma coating process, including a chamber housing a jig for mounting a substrate thereon, a feeder for introducing a nitrogen gas as an atmosphere gas, a Ti source and a Ag source, and a controller configured such that, upon coating, the nitrogen gas is introduced, the Ti source is turned on, and the Ag source is periodically turned on/off.

According to various embodiments, the Ti source and the Ag source are disposed to face each with the jig is positioned therebetween.

According to various embodiments, the controller rotates the jig at about 20~50 rpm.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

The above and other features of the invention are discussed infra.

BRIEF DESCRIPTION OF THE DRAWINGS

The above and other objects, features and advantages of the present invention will be more clearly understood from the following detailed description taken in conjunction with the accompanying drawings, in which.

Figure 1:
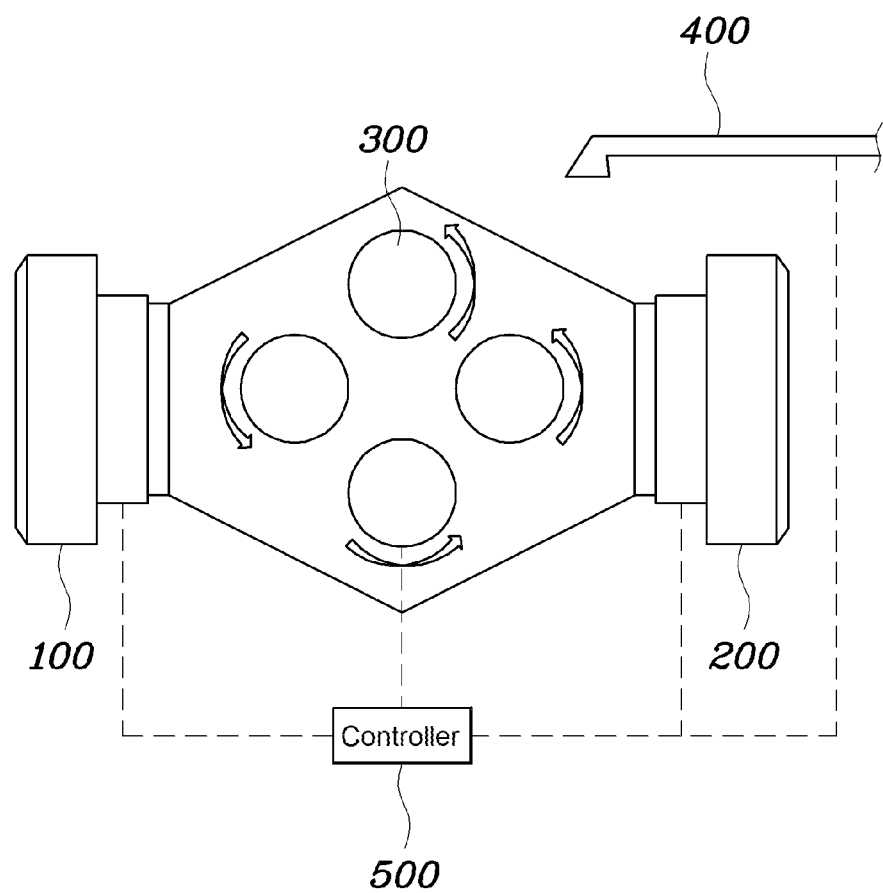
FIG. 1 is a view illustrating a TiAgN coating apparatus according to an embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DESCRIPTION OF SPECIFIC EMBODIMENTS

Hereinafter, a detailed description will be given of a TiAgN coating layer, a TiAgN coating method, and a TiAgN coating apparatus according to preferred embodiments of the present invention with reference to the accompanying drawings.

Figure 2:
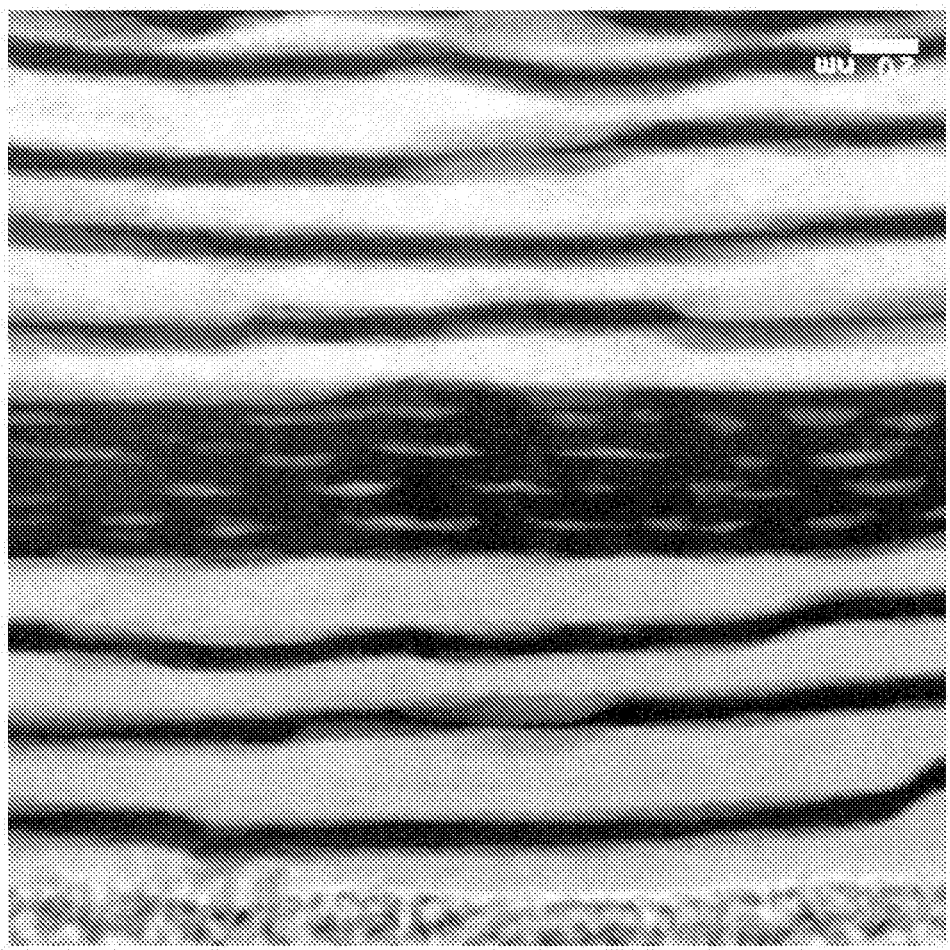
FIGS. 2 to 4 are views illustrating the structure of a TiAgN coating layer according to embodiments of the present invention.
Figure 3:
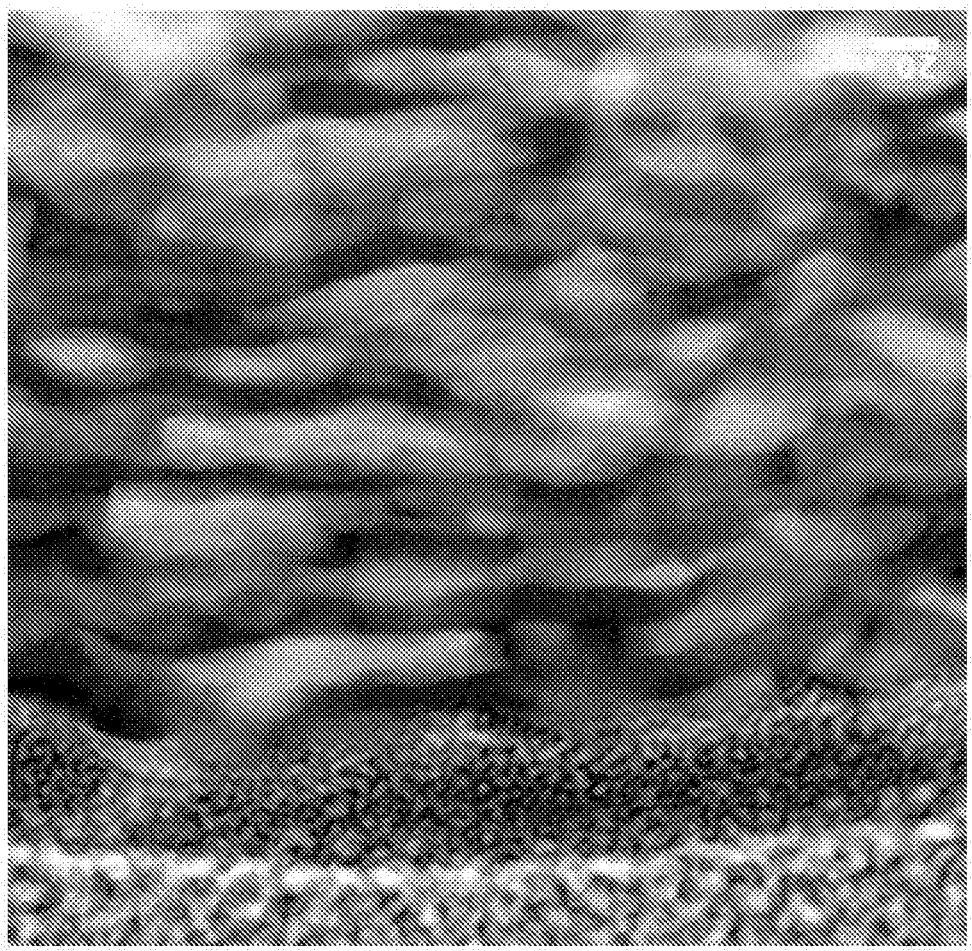
Figure 4:
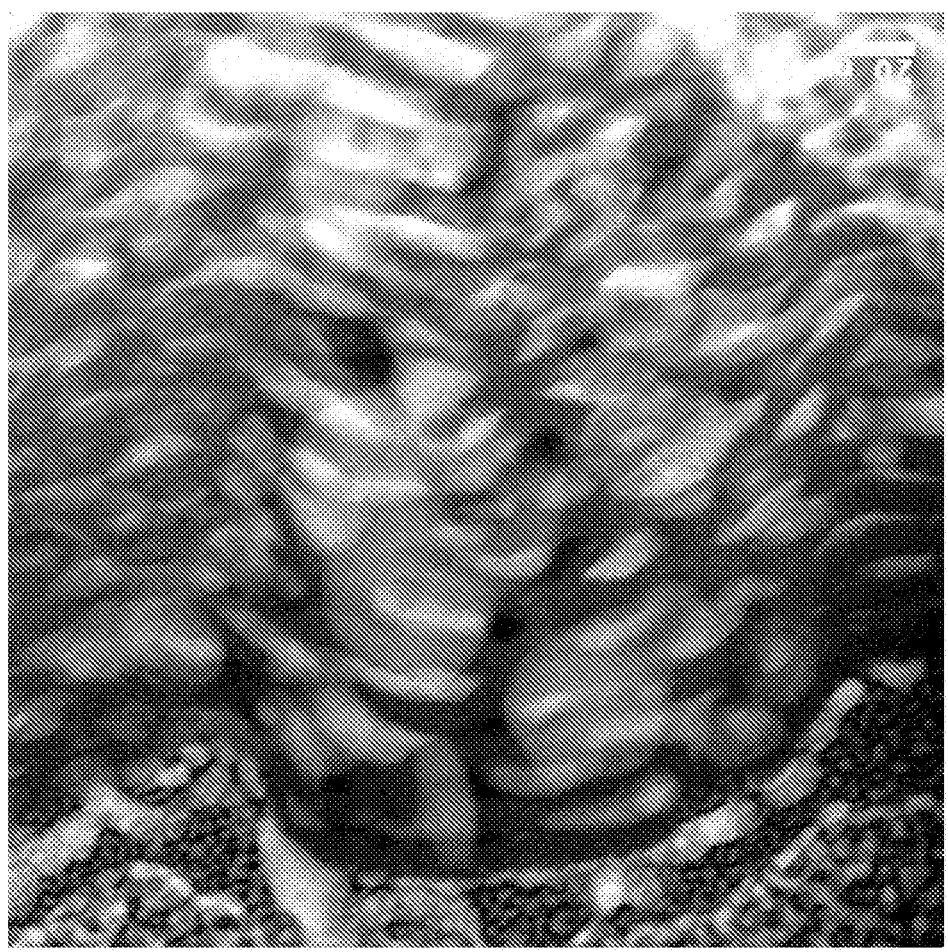
Figure 5:
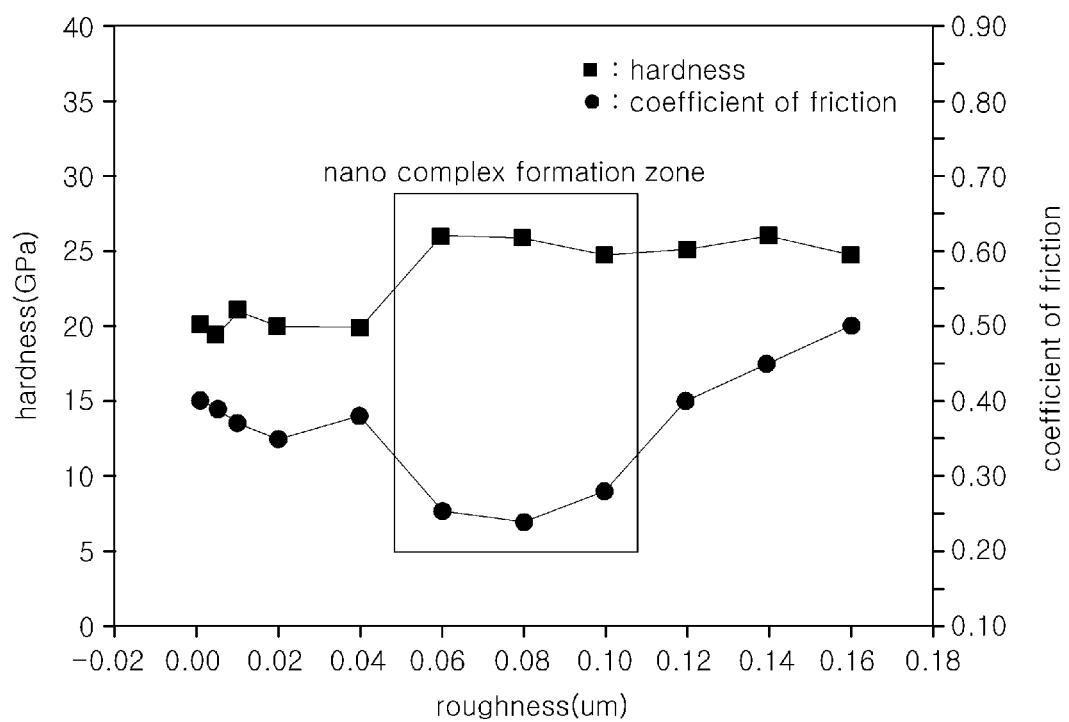
FIGS. 5 to 7 are graphs illustrating the effects of the TiAgN coating layer according to embodiments of the present invention.
Figure 6:
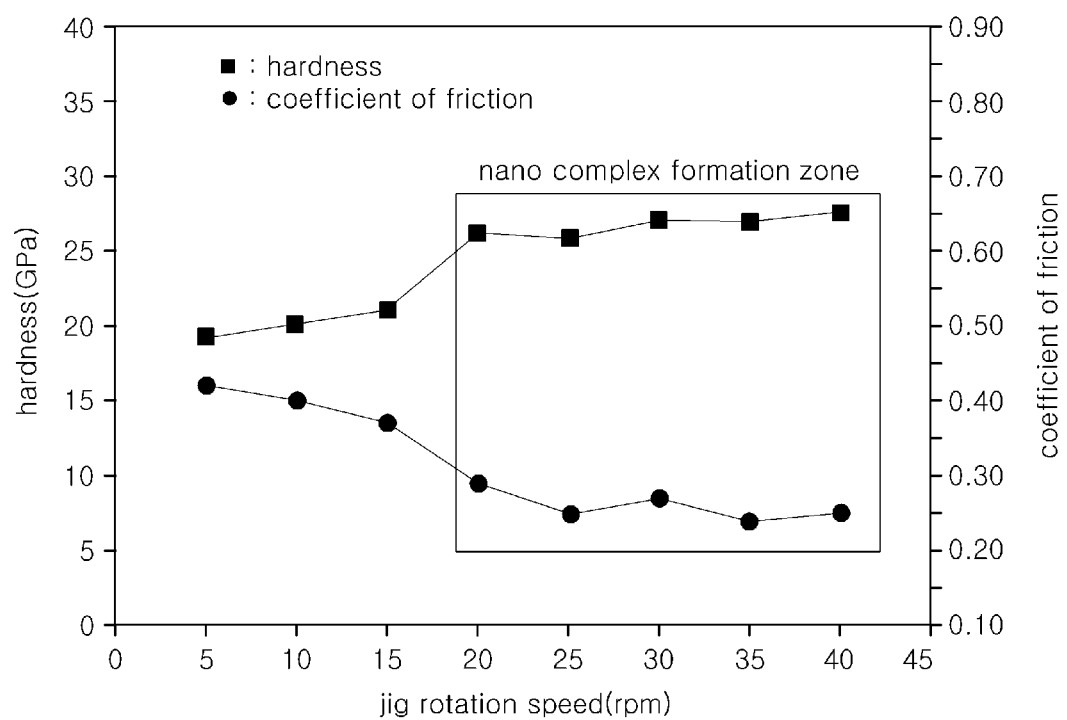
Figure 7:
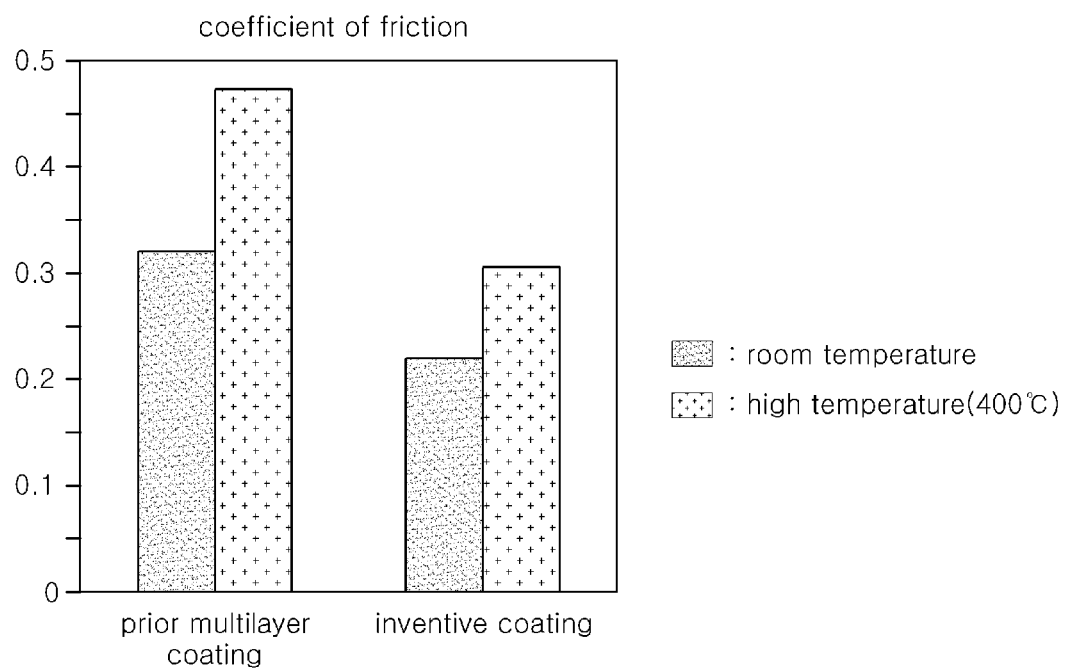

FIG. 1 is a view illustrating a TiAgN coating apparatus according to an embodiment of the present invention, FIGS. 2 to 4 are views illustrating the structure of TiAgN coating layers formed according to embodiments of the present invention, and FIGS. 5 to 7 are graphs illustrating the effects of the TiAgN coating layers formed according to embodiments of the present invention.

According to embodiments of the present invention, a TiAgN coating layer, which is provided with both the superior heat resistance of TiN and low friction characteristics of Ag, is preferably manufactured using a plasma coating process.

Specifically, the TiAgN coating layer according to the present invention is applied on a substrate having a surface roughness of about 0.05~0.1 μm using a plasma coating process. In particular, during the formation of the TiAgN coating layer, an Ag source is periodically and selectively turned on and off while a Ti source is continuously turned on in a nitrogen gas atmosphere.

By providing the surface of the substrate slightly roughened complex layering can take place. Furthermore, according to the present method, the coating layer is formed by periodically turning on/off the Ag source while continuously maintaining the Ti source turned on in a nitrogen gas atmosphere. As a result, formation of a complex TiAgN layer, which contains one or more portions and/or layers of TiAgN and TiN, is possible.

FIG. 1 illustrates a TiAgN coating apparatus according to an embodiment of the present invention. The TiAgN coating apparatus according to the present invention is operated using a plasma coating process, and can include a jig 300 on which a substrate having a surface roughness of about 0.05~0.1 μm may be mounted, a feeder 400 for introducing a nitrogen gas as an atmosphere gas; a Ti source 100 and an Ag source 200; and a controller 500 configured such that, during a coating process, the nitrogen gas is introduced, the Ti source is turned on, and the Ag source is periodically turned on/off.

The Ti source 100 and the Ag source 200 may be disposed to face each other while the jig 300 is positioned therebetween, as shown in FIG. 1. Also, the controller 500 may be further configured so as to rotate the jig 300, particularly at about 20~50 rpm. As such, the coating layer according to the present invention may be formed on a plurality of substrates. For example, plurality of jigs 300 may be provided, each with a substrate mounted thereon (e.g., such as four or any other number of jigs 300 as depicted in FIG. 1). Consequently productivity can be increased.

The following Table 1 shows process conditions in an exemplary embodiment according to the present invention.

TABLE 1

| Coating layer | Process factors and deposition conditions | | | | |
| --- | --- | --- | --- | --- | --- |
| | Jig rotation speed | Arc (Ti) current | Sputter (Ag) current | Voltage | Process Temp. |
| TiAgN | 20~50 rpm | 50~200 A | 1~2.5 A | 100~250 V | 300~450° C. |
| TiN | 20~50 rpm | 50~200 A | — | 100~250 V | 300~450° C. |

The TiAgN coating method according to the present invention under the above conditions is performed using a plasma coating process, and includes processing the surface of a substrate to form a surface roughness of about 0.05~0.1 μm, introducing a nitrogen gas into a chamber in which the substrate is disposed, turning on a Ti source 100, and periodically turning on/off an Ag source 200, thus forming a TiAgN coating layer. In particular, by turning the Ag source 200 on and off selectively and periodically, a complex coating layer can be provided with one or more portions and/or layers of TiAgN and TiN.

According to various embodiments, heating, cleaning, buffering, etc., may be carried out before the above procedures. Buffering is conducted to form a Ti buffer using an ion source so that a TiAgN layer, which is a final functional coating layer, has enhanced adhesion and may be implanted into a substrate of a test sample by increasing bias voltage of the substrate.

During the coating process, the Ti source 100 and the Ag source 200 may be disposed to face each with the substrate positioned on the jig 300 therebetween. Also, coating may be performed by rotating the jig 300 which holds the substrate. In particular, such a jig 300 may be rotated at about 20~50 rpm.

Also, coating may be performed by periodically turning on/off the Ag source 200 at a desired interval, such as an interval of about 30~240 sec.

For example, the Ti source 100 may be a Ti arc source that can be turned on in a nitrogen gas atmosphere, and the Ag source 200 can be an Ag sputter source that can be periodically turned on/off at predetermined intervals. As a result, a complex TiAgN coating layer, which includes both TiAgN portions and TiN portions. As such, according to the present invention, the surface of the substrate is processed to obtain a roughness of about 0.05~0.1 μm, thereby allowing the formation of a discontinuous coating layer, which solves the conventional problems of the inability to provide a coating layer that exhibits both heat resistance and low friction characteristics due to use of, for example, TiN/TiAgN layering.

FIGS. 2 to 4 illustrate the structure of TiAgN coating layers formed according to embodiments of the present invention. As illustrated in FIG. 2, TiN/TiAgN layering was efficiently formed under conditions of a substrate roughness of 0.001 μm and a jig rotation speed of 15 rpm. Also, as illustrated in FIG. 3, the layering was slightly broken ("discontinuous") under conditions of a substrate roughness of 0.001 μm and a jig rotation speed of 20 rpm.

Furthermore, FIG. 4 illustrates a discontinuous TiAgN complex coating layer formed without layering under conditions of a substrate roughness of 0.005 μm and a jig rotation speed of 20 rpm. In the case of the TiAgN coating layer, it was found that maximum discontinuous effects may be obtained under conditions of a substrate roughness of about 0.05~0.1 μm and a jig rotation speed of about 20~50 rpm.

FIGS. 5 to 7 are graphs illustrating the effects of the TiAgN coating layers formed according to the present invention. As illustrated in FIG. 5, hardness and low friction characteristics were superior under conditions of a substrate roughness of 0.05~0.1 μm.

Also, as illustrated in FIG. 6, hardness and low friction characteristics were superior under conditions of a jig rotation speed of 20~50 rpm.

FIG. 7 shows a comparison between a conventional multilayer coating layer (a substrate roughness of 0.001 μm and a jig rotation speed of 15 rpm) and the coating layer according to the present invention. As shown, low friction characteristics are superior at both room temperature and high temperature.

In the TiAgN coating layer having the above structure, the TiAgN coating method and the TiAgN coating apparatus according to the present invention, adhesion of the TiAgN/TiN multilayer coating and low friction characteristics/heat resistance thereof may be improved by 30% or more because of the removal of interlayer discontinuity via the formation of a nano complex.

Also, the present invention allows for the formation of a nano complex via a conventional coating process rather than the conventional hybrid PVD process that makes it difficult to achieve mass production. As such, the present invention maximizes low friction characteristics/heat resistance of the TiAgN coating layer, and enables mass production.

As described hereinbefore, the present invention provides a TiAgN coating layer, a TiAgN coating method and a TiAgN coating apparatus. According to the present invention, because of removal of interlayer discontinuity due to the formation of a nano complex, adhesion of a TiAgN/TiN multilayer coating and low friction characteristics/heat resistance thereof can be increased by 30% or more.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A TiAgN coating method using a plasma coating process, comprising:
processing a surface of a substrate to form a surface roughness of 0.05~0.1 μm; and
introducing a nitrogen gas into a chamber in which the substrate is disposed, turning on a Ti source, and periodically turning an Ag source on and off, thus forming a TiAgN coating layer on the surface of the substrate,
wherein the forming the TiAgN coating layer comprises rotating a jig which holds the substrate at about 20~50 rpm.

2. The method of claim 1, wherein the forming the TiAgN coating layer comprises disposing the Ti source and the Ag source to face each other with the substrate positioned therebetween.

3. The method of claim 1, wherein the forming the TiAgN coating layer comprises periodically turning the Ag source on and off at an interval of about 30~240 sec.

4. A TiAgN coating layer, formed by subjecting a substrate having a surface roughness of about 0.05~0.1 μm to plasma coating by periodically turning an Ag source on and off while a Ti source is continuously turned on in a nitrogen gas atmosphere, wherein the TiAgN coating layer is provided in the form of a nano complex having a grain size of about 50~100 nm.

* * * * *